United States Patent
Kawate et al.

(10) Patent No.: US 7,147,533 B2
(45) Date of Patent: Dec. 12, 2006

(54) METHOD OF PRODUCING ELECTRON EMITTING DEVICE USING CARBON FIBER, ELECTRON SOURCE AND IMAGE FORMING APPARATUS, AND INK FOR PRODUCING CARBON FIBER

(75) Inventors: Shinichi Kawate, Kanagawa (JP); Takeo Tsukamoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 313 days.

(21) Appl. No.: 10/661,627

(22) Filed: Sep. 15, 2003

(65) Prior Publication Data

US 2004/0063839 A1 Apr. 1, 2004

(30) Foreign Application Priority Data

Sep. 26, 2002 (JP) ............................. 2002-280420
Aug. 29, 2003 (JP) ............................. 2003-306158

(51) Int. Cl.
*H01J 9/00* (2006.01)
*H01J 9/02* (2006.01)

(52) U.S. Cl. ............................. 445/49; 445/50; 445/51; 423/447.1; 423/447.3; 977/842; 977/844

(58) Field of Classification Search ........ 313/309–311; 445/49–50; 423/447.1, 447.2, 447.3
See application file for complete search history.

(56) References Cited

U.S. PATENT DOCUMENTS

| | | | |
|---|---|---|---|
| 4,900,483 A | 2/1990 | Witzke et al. | 264/29.2 |
| 4,904,895 A | 2/1990 | Tsukamoto et al. | 313/336 |
| 4,948,573 A * | 8/1990 | Nadkarni et al. | 423/291 |
| 5,171,560 A * | 12/1992 | Tennent | 423/447.3 |
| 5,847,495 A | 12/1998 | Yamanobe et al. | 313/310 |
| 5,872,422 A | 2/1999 | Xu et al. | 313/311 |
| 5,973,444 A | 10/1999 | Xu et al. | 313/309 |
| 5,986,389 A | 11/1999 | Tsukamoto | 313/310 |
| 6,147,449 A | 11/2000 | Iwasaki et al. | 313/495 |
| 6,171,162 B1 | 1/2001 | Iwasaki et al. | 445/6 |
| 6,179,678 B1 | 1/2001 | Kishi et al. | 445/24 |
| 6,184,610 B1 | 2/2001 | Shibata et al. | 313/309 |
| 6,231,413 B1 | 5/2001 | Tsukamoto | 445/24 |
| 6,246,168 B1 | 6/2001 | Kishi et al. | 313/495 |
| 6,288,494 B1 | 9/2001 | Tsukamoto et al. | 315/169.1 |
| 6,333,016 B1 * | 12/2001 | Resasco et al. | 423/447.3 |
| 6,472,814 B1 | 10/2002 | Yamanobe et al. | 313/495 |

(Continued)

FOREIGN PATENT DOCUMENTS

CN    1344674 A   *   4/2002

(Continued)

*Primary Examiner*—Mariceli Santiago
(74) *Attorney, Agent, or Firm*—Fitzpatrick, Cella, Harper & Scinto

(57) ABSTRACT

The present invention provides a method of producing an electron emitting device using a carbon fiber using a catalyst, capable of preferably growing carbon fibers at a low temperature without the need of a high temperature process for growing the carbon fibers or a high temperature alloy process on a substrate, and growing the carbon fibers by a density capable of applying an electric field necessary for the electron emission further effectively. Using alloy particles containing Pd and at least one element selected from the group consisting of Fe, Co, Ni, Y, Rh, Pt, La, Ce, Pr, Nd, Gd, Tb, Dy, Ho, Er, and Lu as the catalyst, a dispersion of the alloy particles is applied on a carbon fiber producing subject surface for providing the alloy particles so as to grow the carbon fibers.

27 Claims, 7 Drawing Sheets

U.S. PATENT DOCUMENTS

| | | |
|---|---|---|
| 6,515,640 B1 | 2/2003 | Tsukamoto et al. ......... 345/75.2 |
| 6,626,719 B1 | 9/2003 | Ono et al. ..................... 445/24 |
| 6,628,053 B1 | 9/2003 | Den et al. ................... 313/310 |
| 6,848,962 B1 | 2/2005 | Kitamura et al. ............. 445/24 |
| 2002/0009637 A1 | 1/2002 | Murakami et al. .......... 429/213 |
| 2002/0031972 A1 | 3/2002 | Kitmura et al. ................ 445/3 |
| 2002/0036452 A1 | 3/2002 | Muroyama et al. ......... 313/310 |
| 2002/0047513 A1 | 4/2002 | Nomura ...................... 313/495 |
| 2002/0057045 A1 | 5/2002 | Tsukamoto ................. 313/309 |
| 2002/0060516 A1 | 5/2002 | Kawate et al. ............. 313/495 |
| 2002/0074947 A1 | 6/2002 | Tsukamoto .............. 315/169.3 |
| 2003/0006684 A1 | 1/2003 | Kawate et al. ............. 313/311 |
| 2003/0048055 A1 | 3/2003 | Ishikura et al. ............ 313/311 |
| 2003/0048056 A1 | 3/2003 | Kitamura et al. .......... 313/311 |
| 2003/0048057 A1 | 3/2003 | Oyama et al. ............. 313/311 |
| 2003/0057860 A1 | 3/2003 | Tsukamoto .............. 315/169.3 |
| 2003/0222560 A1 | 12/2003 | Roach ........................ 313/311 |
| 2004/0060477 A1 | 4/2004 | Iwaki et al. ................ 106/472 |

FOREIGN PATENT DOCUMENTS

| | | |
|---|---|---|
| EP | 0 913 508 A2 | 5/1999 |
| EP | 1 111 647 A2 | 6/2001 |
| EP | 1 122 344 A2 | 8/2001 |
| EP | 1 187 161 A2 | 3/2002 |
| EP | 1 245 704 A2 | 10/2002 |
| EP | 1 291 891 A2 | 3/2003 |
| JP | 3-260119 | 11/1991 |
| JP | 5-287616 | 11/1993 |
| JP | 07-065708 | 3/1995 |
| JP | 08-115652 | 5/1996 |
| JP | 11-011917 | 1/1999 |
| JP | 11-139815 | 5/1999 |
| JP | 2000-200544 | 7/2000 |
| JP | 2002-69643 | 3/2002 |
| JP | 2002-150923 | 5/2002 |
| JP | 2002-150929 | 5/2002 |
| JP | 2002-197965 | 7/2002 |
| WO | WO 01/93292 A1 | 12/2001 |

\* cited by examiner

METHOD OF PRODUCING ELECTRON
EMITTING DEVICE USING CARBON FIBER,
ELECTRON SOURCE AND IMAGE
FORMING APPARATUS, AND INK FOR
PRODUCING CARBON FIBER

BACKGROUND OF THE INVENTION

1. Field of the Invention

The present invention relates to methods of producing an electron emitting device using a carbon fiber, an electron source and an image forming apparatus, and an ink for producing a carbon fiber.

2. Related Background Art

Recently, carbon fibers of a nano size such as a carbon nano tube have attracted the attention. As the method of producing the carbon fibers, various means are known (for example, Japanese Patent Application Laid-Open Nos. 5-287616 and 3-260119, and U.S. Pat. No. 4,900,483).

Furthermore, a large number of attempts have been made for using a nano size carbon fiber such as a carbon nano tube to an field emission type electron-emitting device (for example, see U.S. Pat. No. 5,872,422 and U.S. Published Application No. 2002/9637).

SUMMARY OF THE INVENTION

As a method of growing a carbon fiber on a substrate, there is a method of executing the thermal CVD with a catalyst layer disposed on the substrate in a hydrocarbon gas. According to the conventional method, a plurality of carbon fibers are grown on the substrate by an extremely high density so that the electric field strength to be applied to the top end of each carbon fiber becomes low. As a result, in many cases, the characteristics of the carbon fiber having high electron emitting ability cannot be utilized sufficiently.

Accordingly, an object of the present invention is to provide a method of producing an electron emitting device using a carbon fiber, an electron source and an image forming apparatus, capable of growing the carbon fiber at a relatively low temperature. Moreover, another object of the present invention is to disperse and arrange a plurality of catalyst particles on a substrate by a desired density easily with a good controllability so that the carbon fiber can be grown by a density capable of effectively applying the electric field.

The present invention has been made in order to achieve the above objects.

According to one aspect of the present invention, there is provided a method of producing an electron-emitting device having a carbon fiber, comprising: (A) a step of applying a liquid which includes dispersed particles onto a substrate; and (B) a step of forming a carbon fiber by contacting the particles applied on said substrate with a carbon containing gas, wherein each of said particles contains at least two kinds of elements.

According to another aspect of the present invention, there is provided a method of producing an electron source having a plurality of electron-emitting devices, wherein the electron-emitting devices are produced by the method of producing an electron-emitting device according to claim 1.

According to a further aspect of the present invention, there is provided a method of producing an image forming apparatus comprising an electron source, and an image forming member disposed facing the electron source, wherein the electron source is produced by the method of producing an electron source according to claim 18.

According to still another aspect of the present invention, there is provided an ink for producing a carbon fiber, comprising: particles containing two or more kinds of elements; a polymer; and a dispersion medium for dispersing the particles.

BRIEF DESCRIPTION OF THE DRAWINGS

FIGS. 2A, 2B, 2C-1, 2C-2, 2D-1, 2D-2, 2E-1 and 2E-2 are views showing an example of a process for producing an electron emitting device using the method of producing a carbon fiber according to the present invention.

DETAILED DESCRIPTION OF THE PREFERRED EMBODIMENTS

Figure 1A:
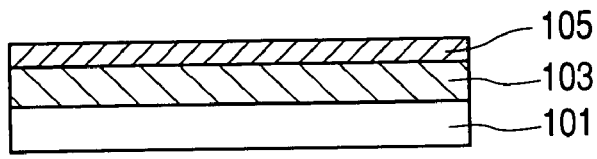
FIGS. 1A, 1B-1, 1B-2, 1C-1 and 1C-2 are views showing an example of a method of producing a carbon fiber according to the present invention.

Examples of methods of producing an electron-emitting device having a carbon fiber, an electron source and an image forming apparatus according to the present invention will be explained as follows. The size of the component parts, the material, the shape, the relative positions, or the like described below are not to limit the scope of the present invention thereto. Similarly, the production process described below is not the only one.

First, a catalyst used for growing a carbon fiber in the present invention will be explained.

The catalyst used for growing a carbon fiber in the present invention is particles containing a plurality of metals. In particular, alloy particles are preferable. As the particles containing a plurality of metals, particles containing Pd and at least one element selected from the group consisting of Fe, Co, Ni, Y, Rh, Pt, La, Ce, Pr, Nd, Gd, Tb, Dy, Ho, Er, and Lu are preferable. Moreover, it is preferable to include at least any one of Fe, Ni and Co as the element to be added in a combination with a Pd. And in particular, a combination of Pd and Co is preferable.

Here, the "carbon fiber" and the "fiber containing a carbon as the main component" in the present invention include a carbon nano tube, a graphite nano fiber, an amorphous carbon fiber, a diamond fiber, or the like. In particular, a carbon fiber having a 5 nm or more and 100 nm or less average diameter is preferable, and furthermore, a carbon fiber having a 10 nm or more and 50 nm or less average diameter is more preferable. Moreover, the "carbon fiber" and the "fiber containing a carbon as the main component" in the present invention denote a member having a large ratio of the diameter and the length (typically, the aspect ratio (length/diameter) is 10 ore more, preferably it is 100 or more, and further preferably it is 1,000 or more).

In the present invention, the following is the reason why it is preferable that the particles used as the catalyst contains Pd and at least one element selected from the group consisting of Fe, Co, Ni, Y, Rh, Pt, La, Ce, Pr, Nd, Gd, Tb, Dy, Ho, Er, and Lu.

In the particle state, in the case the catalysts other than the Pd are exposed to the atmosphere, they become an oxide due to the chemical reaction with the moisture or the oxygen in the atmosphere. Unlike the other catalyst materials, the Pd maintains the metal bond state more stably. In particular, in the case where Fe based metal particles are exposed to the atmosphere, drastic chemical reaction is generated so as to give rise to the danger of the dust explosion, however, the metal Pd does not give rise to such a danger. Furthermore, according to a metal catalyst containing Pd and Co, Ni, Fe, or the like, since the oxidation reaction proceeds slowly, the catalyst can be handled safely.

In contrast, the Pd has a peculiar behavior which is related to the nature of having a high absorption characteristic to hydrogen. In the case where the Pd is exposed to a reducing atmosphere such as a hydrogen containing atmosphere, the particles containing a hydrogen are coupled with each other at a relatively low temperature (about 450° C. or more) so as to become particles with a shape larger than that in the initial state. According to the phenomenon, when the Pd particles are changed to a larger shape, not only the growth temperature of the carbon fiber is made higher but also the threshold value of the electron emission is made higher when using the same as the electron-emitting material, and thus it is problematic.

As a method of avoiding the problems, there is a method of not exposing the catalyst to hydrogen and/or hydrocarbon as much as possible until it reaches at the temperature necessary for the growth. However, as a further effective method, the present inventors have found out that coupling of the particles with each other so as to have the shape change to have a shape larger than that in the initial state can be prevented by providing the particles containing a Pd and at least one element selected from the group consisting of Fe, Co, Ni, Y, Rh, Pt, La, Ce, Pr, Nd, Gd, Tb, Dy, Ho, Er, and Lu.

Moreover, among the elements to be added in a combination with Pd, it is preferable to contain at least any one of Fe, Ni, and Co. In particular, a combination of Pd and Co is preferable. When a carbon fiber is produced using particles containing an element selected from Fe, Ni and Co, and Pd, and the obtained carbon fiber is applied for an electron emitting device, a sharp rising characteristic can be obtained particularly in the applied voltage-electron emission current characteristic. Moreover, a stable electron emission characteristic can be obtained over a long term. Furthermore, it is preferable to provide the particles with the element to be added in a combination with Pd in an alloy state with the Pd in terms of producing a large number of carbon fibers stably with a high uniformity.

As to the atomic ratio of Pd and the element used in a combination with the Pd, an remarkable effect can be provided in the case where the added element used in the combination with the Pd is 5 atm % (atomic percentage) or more with respect to the Pd. Furthermore, it is preferable that the added element used in a combination with the Pd is 20 atm % (atomic percentage) or more with respect to the Pd. Moreover, when it is more than 80 atm % (atomic percentage), the carbon fiber growth tends to slow down, or an active reducing process by adding a hydrogen, or the like tends to be needed. Furthermore, in the case the ratio (atomic ratio) of the element to be added to the Pd with respect to the Pd is more than 80 atm % (atomic percentage), its characteristic becomes substantially same as the characteristic of a catalyst made only from the element to be added to Pd. In consequence, the crystallization property of the carbon fiber to be formed using the catalyst made only from said element to be added to Pd tend to be deteriorated. Therefore, the addition amount of the element to be added to the Pd is preferably 80 atm % (atomic percentage) or less. In particular, when the ratio of Co in each of the catalyst particles containing Pd and Co is less than 20 atm %, according to the electron-emitting device having a plurality of the carbon fibers, a preferable electron-emitting characteristic cannot be obtained over a long term. Moreover, when the ratio of the Co in each of the catalyst particles containing a Pd and a Co is more than 80 atm %, it is substantially difficult to form the lowest growth temperature of the carbon fiber using a commonly used glass substrate. Furthermore, when the ratio of the Co is more than 80 atm %, although it is preferable in terms of the stability, the electron-emitting characteristic is deteriorated. Therefore, it is preferable that the ratio of the Co in each of the catalyst particles containing Pd and Co is 20 atm % or more and 80 atm % or less.

The method of producing the particle is not particularly limited, and any production method may be used as long as the particle satisfying the above described requirements can be formed. Even if a high temperature process is necessary at the time of producing the particle, it does not influence at all the processes from the coating step of the particles onto a base member and thereafter.

Moreover, although it will be described later, an assembly of a large number of carbon fibers (it may be referred to also as a "film containing a plurality of carbon fibers") is adopted for one electron emitting device when a carbon fiber is applied to an electron emitting device. When forming such a film containing a plurality of carbon fibers stably with a high uniformity, it is important that the Pd and the element to be added contained in the catalyst particle of the present invention are in an alloy state. Therefore, preferably, the particles are in an alloy state at the time of growing the carbon fibers. In the meantime, in the stage before growing the carbon fibers (for example, in a state dispersed in a dispersion (dispersion liquid) to be described later), the Pd and the added elements contained in the particles are not necessarily in an alloy state.

The average particle size of the particles used for the growth of the carbon fibers is 1 nm or more and 100 nm or less, preferably 1 nm or more and 50 nm or less, and further preferably 1 nm or more and 20 nm or less in order to maintain the carbon fiber growth temperature at a low level and lower the threshold value of the electron emission at the time of using the same as the electron emitting material.

According to the present invention, the particles are disposed on a base member in order to grow the carbon fibers on the base member. The particles are applied onto the base member by applying a liquid (dispersion liquid) containing a large number of the dispersed particles (applying an ink for producing an electron emitting device, using a carbon fiber) onto the base member. In general, the application of the liquid containing the dispersed particles (dispersed phase) can be executed by coating a dispersion liquid prepared by dispersing the particles in a dispersion medium. Hereinafter, the dispersion liquid will be explained.

As the dispersion medium, water or an organic solvent can be used. As the organic solvent, for example, ethanol, isopropyl alcohol, benzene, or the like can be used. In consideration of the burden to the environment, it is preferable to use water as the dispersion medium.

In the dispersion liquid, it is preferable to add a polymer having the protection colloid function as an anti aggregating agent in order to dispose the particles discretely with a desired interval provided on the base member. As the polymer, for example, it is preferable to use PVP (polyvinyl pyrrolidone), PVA (polyvinyl alcohol), polyacrylic acids (polyacrylic acid, polymethacrylic acid, and homologues thereof (ester, amide, nitrile, or the like)). As the polymethacrylic acids, for example, methyl polymethacrylate, and polyacrilonitrile can be used. In consideration of the case of using water as the dispersion medium, it is preferable to use a water soluble polymer as the polymer used for an ink of the present invention. Degree of polymerization of the water-soluble polymer compound is preferably in the range of 400 to 2,000.

It is preferable to contain the anti aggregating agent by 0.1 wt % or more and 30 wt % or less with respect to the dispersion from the viewpoint of the stability of the particles in the dispersion liquid. Furthermore, it is more preferable that the anti aggregating agent is contained in a range of 0.2 wt % or more and 10 wt % or less with respect to the dispersion.

In the dispersion, the polymer covers (wraps) each of the particles. Then, in the case where the polymer is added in the dispersion in a range of 0.1 wt % or more and 30 wt % or less, the polymer covers the surface of each particle to the extent that the average particle size of the particles is increased in a range of 5 nm or more and 50 nm or less. That is, the particles are covered with the polymer by 2.5 nm or more and 25 nm or less film thickness on average.

Then, it is preferable that the particles are contained in the dispersion by a ratio of 1 g/L or less. Furthermore, it is more preferable that they are contained by a ratio of 0.1 g/L or less in terms of improving the electric field strength to be applied effectively to the grown carbon fibers. Moreover, it is preferable that the particles are contained by 0.01 g/L or more with respect to the dispersion in terms of obtaining a sufficient emission current density from one electron emitting device. In this invention, "g/L" means a gram per liter.

Furthermore, as it will be described later, depending on the concentration of the anti aggregating agent in the dispersion, the particles are not only disposed on the base member with the particles in a dispersed state one by one but also they may be dispersed on the base member as aggregates of a plurality of the particles aggregated on the base member. Therefore, whether or not the anti aggregating agent is added, and the addition amount in the case where it is added can be selected according to the dispersion state of a desired carbon fiber. However, from the viewpoint of the controllability of the carbon fiber density, it is preferable that the anti aggregating agent is added in the dispersion medium for dispersing on the base member with a high uniformity.

Next, the outline of the method of producing a carbon fiber in the present invention will be explained as follows.

First, a dispersion liquid containing a large number of the particles (dispersed phase) is applied on a carbon fiber production subject surface (for example, a base member to be the base for forming the electron emitting device and the electron source to be described later (a substrate or an electrode)). Since electrons need to be supplied to the carbon fibers in the case where carbon fibers are applied for the electron emitting device, the dispersion liquid is applied onto a conductive member such as an electrode. The dispersion liquid may further include a photosensitive element. Catalyst particles can be disposed only on the predetermined areas by adding a photosensitive element (for example, photosensitive polymer) to the dispersion liquid, irradiating light to the desired region of the coated film formed by applying the dispersion liquid on the carbon fiber production subject surface, and removing the coated film of the region irradiated by light or the region other than the region irradiated by light.

Then, after forming the coating film containing the particles (and a polymer) on the substrate or electrode, by removing the dispersion medium (eliminating the polymer and the dispersion medium in the case where a polymer is included) by heating the coating film, the particles are provided on the base member as the carbon fiber production subject surface. In general, the dispersion medium is removed by a drying step at about 120° C. However, when only the drying step is carried out, it is difficult to strongly fix the above particles to a substrate. Further, when the areas of catalyst particles to be disposed are patterned (especially, when the patterning is carried out by a wet process), a material constituting the catalyst particles might be lost with a peeling agent and solvent during pattering. Therefore, it is preferable to carry out pattern the catalyst particles oxidized by heating the coated film in an oxidation atmosphere and then reduce the oxidized particles by heating them, for example, in a reducing gas atmosphere.

Thus, the loss of a material constituting the catalyst particles with a peeling agent and solvent during pattering can be suppressed and the fibers can be stably grown as described below, by oxidizing catalyst particles disposed on a substrate and then reducing.

Then, by supplying the energy necessary for realizing the catalyst function of the particles disposed on the base member (as the easiest method, by heating the base member together with the particles), and contacting the particles with the catalyst function realized with a carbon containing gas (it corresponds to the source gas of the CVD method), the carbon fibers can be grown on the base member (CVD growth).

According to the process, the carbon fibers can be grown on the base member on which the carbon fibers are desired to be grown. In the present invention, the composition of the particles at the time of growing the carbon fibers and the composition of the particles dispersed in the dispersion liquid are basically same, but the degree of crystallinity may be different. For example, the case of having the particles in the dispersion liquid in a state as a mixture of different kinds of materials, and the particles at the time of growing the carbon fibers in an alloy state, or the like corresponds to a change of the degree of crystallinity. Moreover, the case of having the particles in the dispersion forming particles by gathering clusters of different elements with each other, and the particles at the time of growing the carbon fibers forming a particle as an alloy of different kind of elements, or the like also corresponds to a change of the degree of crystallinity. When the particles comprise a Pd and a Co, it is preferable to have the particles in an alloy state both in the dispersion and at the time of growing the carbon fibers in terms of the stability.

As the method of applying the dispersion liquid onto the base member, a spin coating method, a spray method, an ink jet method, a dipping method (soaking method), a printing method such as offset printing, or the like can be used optionally. At the time of Applying the dispersion, the particle density on the base member can be controlled not only by the adjustment of the concentration of the particle dispersion, but also by the adjustment of the rotational frequency in the spin coating method, the number of applying the liquid droplets in the ink jet method, or the like.

By disposing the particles on the base member by a low density without concentrating the particles by a high density, the carbon fibers to be produced later can be disposed by a low density. As a result, the decline of the effective electric field strength to be applied on the end part of the carbon fibers disposed on the base member by a large number can be restrained (the effective electric field strength to be applied on the end part of the carbon fibers can be made stronger).

According to the present invention, the carbon fibers can be grown by the simpler thermal CVD method instead of using the plasma to the base member with the particle dispersion applied. Moreover, as the carbon containing gas to be contacted with the catalyst particles for growing the carbon fibers, for example, in addition to a hydrocarbon gas such as acetylene, ethylene, methane, propane, and propylene, the vapor of an organic solvent such as ethanol and acetone can be used as well. In order to obtain a high quality carbon fiber, it is preferable to use a hydrocarbon gas. Furthermore, it is preferable to introduce a hydrogen together with the carbon containing gas into the environment for growing the carbon fibers (for example, into the chamber) for efficiently growing the carbon fibers.

Figure 8:
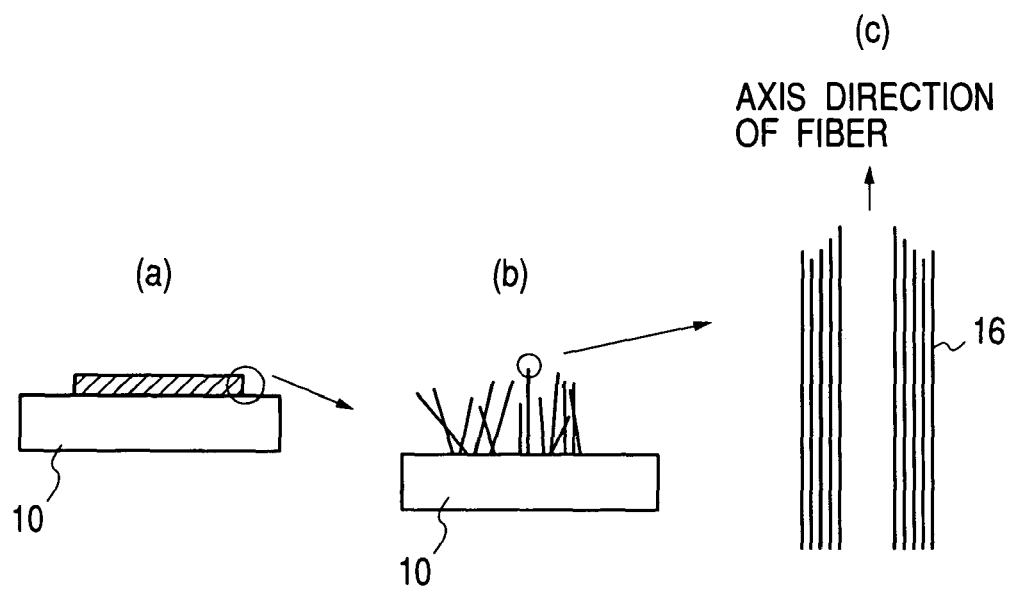
FIG. 8 is a schematic diagram showing the configuration of a carbon nano tube.
Figure 9:
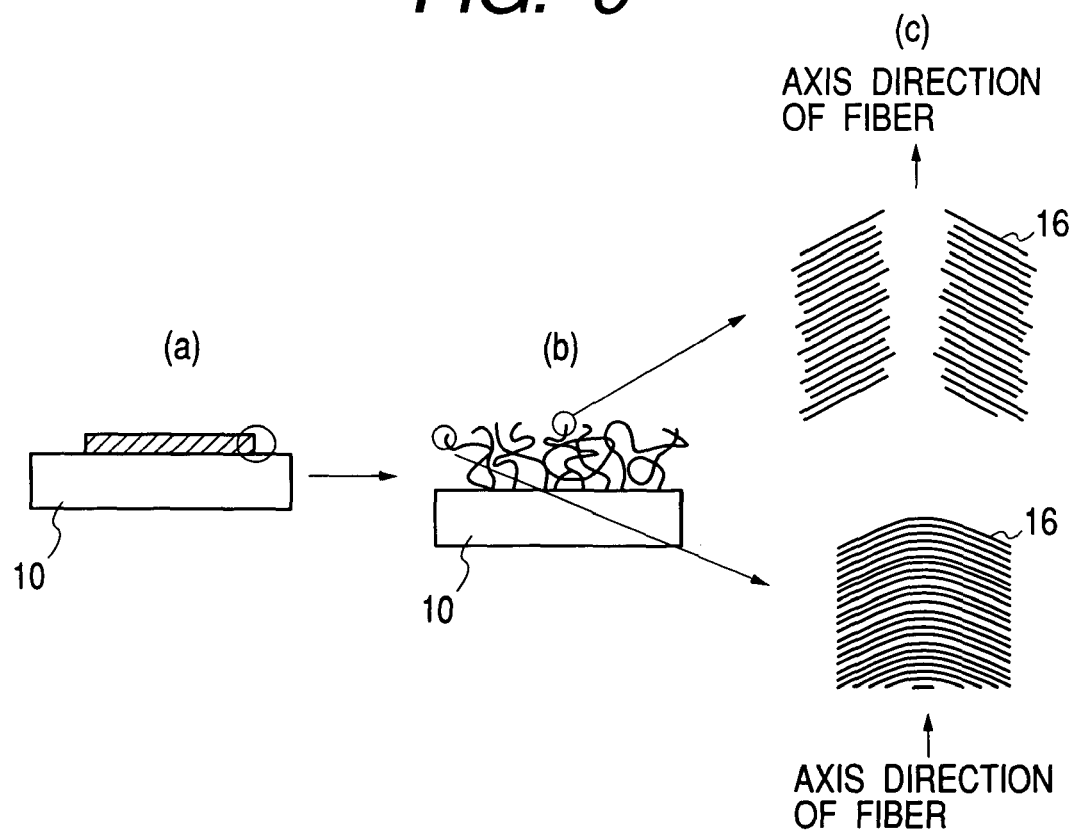
FIG. 9 is a schematic diagram showing the configuration of a graphite nano fiber.

FIGS. 8 and 9 show a schematic diagram of an example of a film including a plurality of carbon fibers to be obtained by decomposing the carbon containing gas (preferably the hydrocarbon gas) utilizing the particle catalyst function. Each figure schematically shows the carbon fiber embodiment observed by an optical microscope level (to 1,000 times) on the leftmost side, the carbon fiber embodiment observed by a scanning electron microscope (SEM) level (to 100,000 times) in the middle, and the carbon fiber embodiment observed by a transmission type electron microscope (TEM) level (to 1,000,000 times) on the rightmost side.

The carbon fiber shown in FIG. 8 comprising a graphen 16 having a cylindrical shape is called a carbon nano tube. One having the cylindrical graphen 16 in a multiple structure is called a multi wall carbon nano tube. In the case where it is used as the electron emitting member of an electron emitting device, the threshold electric field necessary for emitting the electrons can be made lowest particularly with a structure having the top end of the tube opened.

Moreover, FIG. 9 shows schematically a graphite nano fiber. The carbon fiber of this embodiment comprises a plurality of graphens 16 laminated (stacked) in the axial direction of the fiber. Each graphen 16 is arranged not perpendicularly with respect to the fiber axial direction. More specifically, as it is shown in the rightmost side schematic diagram of FIG. 9, the graphite nano fiber denotes a fiber-like substance with the graphens 16 laminated (stacked) in its longitudinal direction (fiber axial direction). Or as it is shown in the rightmost side schematic diagram of FIG. 9, it denotes a fiber-like substance with the graphens 16 arranged non parallel with respect to the fiber axis. The case having the graphens disposed substantially perpendicularly to the fiber axial direction is also included in the graphite nano fiber in the present invention.

One sheet of a graphite is called as a "graphen" or a "graphen sheet". Graphite comprises plurality of stacked or layered carbon planes. Each carbon plane comprises a repeated hexagon having a carbon atom at each vertex thereof and having a covalent bond along each side thereof. The covalent bond is caused by $sp^2$ hybrid orbitals of carbon atoms. Ideally, the distance (interval) between the neighboring carbon planes is maintained at 3.354 Å.

For both carbon fibers, the threshold electric field strength needed for the electron emission is about 1 V to 10 V/μm, and thus they have the characteristic preferable as the electron emitting material. In the case where an electron emitting device is formed using the carbon fibers, one electron emitting device includes a plurality of carbon fibers. Then, as the electron emitting material, it is more preferable to use a graphite nano fiber as the carbon fiber because a larger electron emission current density can be ensured in an electron emitting device using a plurality of the graphite nano fibers as the electron emitting material (a film comprising a plurality of graphite nano fibers as the electron emitting film) compared with the case of using a carbon nano tube. Unlike the carbon nano tube, or the like, the graphite nano fiber include extremely fine projections on its surface (fiber side surface) as shown in FIG. 9. Therefore an electric field may be easily concentrated at the surface of the graphite nanofiber, and thus, it is conceived that electrons can easily be emitted from the fiber. Furthermore, since the graphens included in the fiber are extend from the center axis of carbon fiber in the direction of external circumference (surface) of the fiber, it is conceived that electrons can easily be emitted. In contrast, according to the carbon nano tube, basically, since the fiber side surface is chemically inert. Furthermore, unlike the "graphite nanofiber", the "carbon nanotube" has quite smooth side surface (projections are not exist on the side surface of the "carbon nanotube"). Thus, it is conceived that the threshold voltage required for the electron emission from the side of the "carbon nanotube" is higher than that of the "graphite nanotube". Because of this, application of the "graphite nanofiber" to the electron-emitting device (emitter) is more preferable than application of the "carbon nanotube" to the electron-emitting device (emitter).

In the present invention, an emitter is provided by electrically connecting a film comprising a plurality of carbon fibers with a cathode electrode. Then, by arranging an electrode (a gate electrode or an anode electrode facing the emitter) for drawing (extracting) out the electrons from the emitter or an electrode for controlling the electrons emitted from the carbon fibers, an electron emitting device (an electron emitting device of the so-called diode structure) can be provided. Furthermore, by disposing a luminant such as a phosphor for emitting a light by the irradiation of the electrons emitted from the carbon fibers on the anode (or electrode for drawing electrons from the fibers), a light emitting device such as a lamp can be provided. Moreover, by disposing a transparent substrate having a luminant such as a phosphor and an anode so as to face the base member with a plurality of electron emitting devices having a plurality of carbon fibers, an image display apparatus such as a display can be provided as well.

According to an electron emitting device using the carbon fibers of the present invention, a light emitting device using the electron-emitting device, or the image display apparatus using the electron-emitting devices, since the electron emission can be carried out stably without the need of keeping the inside in a Ultra High Vacuum state unlike the conventional electron-emitting device, and furthermore, the electron emission can be carried out at a low electric field, a highly reliable device can be produced extremely easily.

In the present invention, the "film comprising a plurality of carbon fibers", or the "film including a plurality of carbon fibers" also, include the state with a plurality of carbon fibers disposed discretely on the base member. Therefore, according to this invention, it is not limited to the state of which a plurality of carbon fibers are being connected each other.

Hereinafter, with reference to FIGS. 1A to 1C-2, an example of a process for producing an electron emitting device using a carbon fiber will be explained in detail. FIGS. 1A to 1C-2 is a cross-sectional view schematically showing a simple configuration without an extraction electrode. Such an electron emitting device is used in a state of facing an extraction (anode) electrode so that an electron emitting device of the so-called diode structure can be provided.

In FIGS. 1A to 1C-2, reference numeral 101 is an insulating substrate, 103 is a cathode electrode, 105 is a conductive material layer, 106 is a catarytic particle, and 107 is a carbon fiber. FIGS. 1A to 1C-2 shows the process for growing a plurality of carbon fibers 107 to be the emitter material on the conductive material layer 105, utilizing the catalyst function of the particles 106 disposed on the conductive material layer 105. The material of the cathode electrode 103 can be selected optionally from for example, a metal, a nitride of a metal, a carbide of a metal, a boride of a metal, a semiconductor, a metal compound of a semiconductor, or the like. It is preferable that the material of the cathode electrode 103 is a thermally resistant material such as a metal, a nitride of a metal, and a carbide of a metal. The cathode electrode 103 and the conductive material layer 105 are made of a conductive material.

It depends on also the combination of the material of the particles to be used and the material of the cathode electrode, the conductive material layer 105 needs not be always provided. However, in order to spread the designing freedom of the combination of the cathode electrode and the particles, it is preferable to use the conductive material layer 105. When the conductive material layer 105 is used, it is preferable to use an oxide or a nitride of a material selected from the group consisting of Ti, Zr, Nb and Al as the conductive material layer 105. It is particularly preferable to use TiN. The conductive material layer 105 is for restraining a reaction, which is caused by heating at the time of growing the carbon fibers, between the electrode 103 and the particles 106.

As the insulating substrate 101, an electrically insulating plate such as a glass plate can be used. With the surface thereof washed sufficiently, it is provided for the use.

The carbon fibers 107 as the emitter material are a carbon nano tuber, a graphite nano fiber, or the like with the CVD growth executed using the particles 106.

Hereinafter, each step will be explained.

(Step 1)

After sufficiently washing the substrate 101, the cathode electrode 103 and the conductive material layer 105 are formed (FIG. 1A).

(Step 2)

A dispersion liquid containing the particles 106 is coated on the cathode electrode 103 (on the conductive material layer 105 in the case the conductive material layer 105 is formed on the cathode electrode 103). Then, by eliminating at least the dispersion medium from the coating film (specifically, by heating), a large number of the particles 106 containing a plurality of metals are provided on the conductive material layer 105.

Especially, an oxidation atmosphere is preferable to eliminating the dispersion medium and anti aggregating agent (specifically, by heating) By carrying out a heating process in an oxidation atmosphere, at least the surface of the particles 106 is oxidized and adhesion to the substrate (for example, the cathode electrode 103) is increased, thereby suppressing elution of the elements constituting the particle 106 and elimination of the particles 106 with the solution caused by cleaning with a solution (for example, peeling liquid) used in a patterning step even when the patterning step such as lift-off, photolithography and the like is carried out between the step 2 and the step 3 as below. Further, a fiber can be stably grown.

The density of the particles disposed on the surface of the substrate 101 can be controlled according to the adjustment of the particle concentration in the dispersion liquid, the adjustment of the rotational frequency at the time of spin coating, or the like.

Figures 1, 1B:
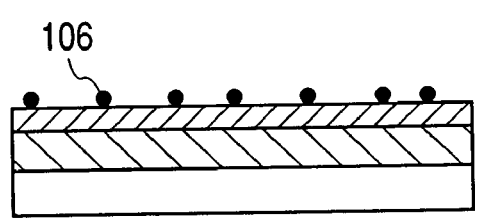
Figures 1, 1B, 2:
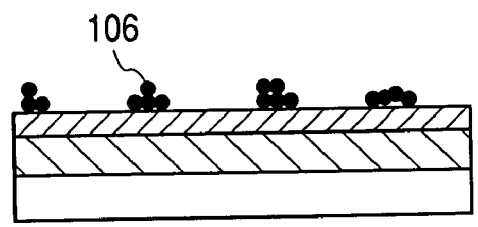

At the time, in the case where one with the particles 106 dispersed with the anti aggregating agent added is used as the dispersion, the particles 106 are applied on the substrate 101 with each particle dispersed in the dispersion liquid separated with each other as it is without substantial aggregation on the base member (on the conductive material layer 105) (FIG. 1B-1). Moreover, in the case where a dispersion without adding the anti aggregating agent (or with the anti aggregating agent added by a content smaller than the preferable range) is used, the particles 106 are applied on the substrate 101 in a state dispersed per aggregates formed by aggregating a plurality of particles separated with each other (FIG. 1B-2).

Note that, in this invention, photosensitive material (agent) may be added to said dispersed liquid for patterning the coating film. Negative-type or positive-type photosensitive material (agent) can be added to said dispersed liquid. Therefore, in the case of using the photosensitive material, the Step2 described above further comprises a step of irradiating a region of the coating film (dried coating film) with light and a step of removing unnecessary region of the coating film. When the negative-type photosensitive material was used, the irradiation region is wanted region of the coating film. And, when the positive-type photosensitive material was used, the irradiation region is uswanted (unnecessary) region of the coating fiim.

(Step 3)

Figures 1, 1C:
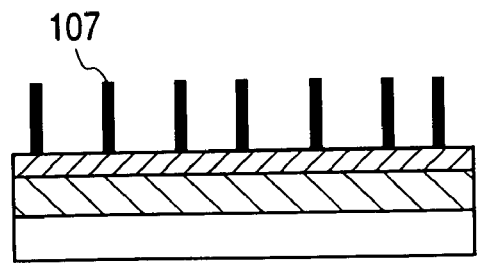
Figures 1, 1C, 2:
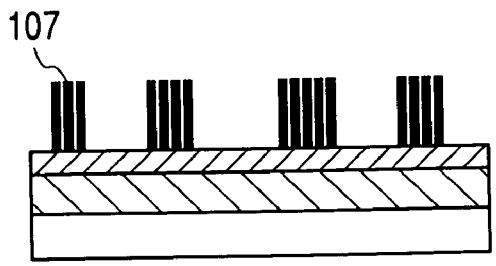

Then, by proceeding a thermal decomposition (thermal CVD) process to the carbon containing gas using the catalyst function of the particles 106 in a carbon containing gas, the carbon fibers 107 are grown. At the time, in the case where the dispersion with the anti aggregating agent added is used, although based on a particle size, a carbon fiber 107 is generally grown for each one particle (FIG. 1C-1). Moreover, in the case the dispersion without adding the anti aggregating agent (or with the anti aggregating agent added by a content smaller than the preferable range) is used, a bundle of the carbon fibers 107 is grown for one aggregate 106 comprising a plurality of the particles (FIG. 1C-2).

When an oxidation step of the particles 106 is added to the step 2, it is preferable to add a reduction step of the particles 106 (for example, a step in which the particles is heated in a reducing gas such as hydrogen) before the above step 3 (after the patterning step). Further, it may carry out the above reduction step with the step 3 in which a carbon fiber is grown. That is, while the above carbon containing gas is mixed with a reducing gas such as a hydrogen gas, the above carbon fiber 107 is grown. Further, if a carbon containing gas has reduction property, it is not necessary to add a reducing gas.

When a voltage is applied in a vacuum between the cathode electrode 103 and an unillustrated anode (anode plate) disposed above the substrate 101 for the electron emission from the accordingly formed carbon fibers 107, electrons are generally emitted from the top ends of the carbon fibers 107 toward the anode.

As mentioned above, by dispersing the particles 106 on the base member by a low density using the particle containing dispersion of the present invention, a large number of the carbon fibers 107 can be disposed with an appropriate distance provided with each other. As a result, the electric field can be applied further effectively for each carbon fiber 107. Thereby, the threshold voltage of the electron emission can be made lower so that the electric field necessary for obtaining the electron emission current of the same value can be reduced.

Figure 2A:
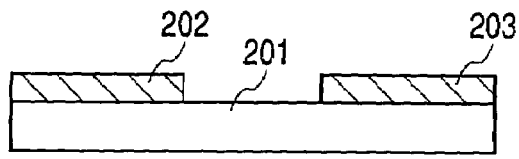

Hereinafter, an example of the process for producing an electron emitting device shown in FIGS. 3A and 3B will be explained with reference to FIGS. 2A to 2E-2. The example shown in FIGS. 2A to 2E-2, and FIGS. 3A and 3B is an embodiment comprising a first electrode (cathode electrode) 203 and a second electrode (extraction electrode (gate electrode) for extracting electrons from the fiber 207 or control electrode for controlling an emitted electrons from the fiber 207) disposed on the surface of the same substrate 201, separated with each other. By disposing an anode electrode 411, facing the substrate 201 with the second electrode 202 and the first electrode 203 disposed, an electron emitting device of the so-called triode structure can be formed (see FIG. 4). Furthermore, in the device structure shown in FIGS. 3A and 3B, when using the second electrode 202 as the control electrode for controlling the electrons emitted from the fiber, the anode electrode 411 operates also as an electron extracting electrode from the fiber.

FIGS. 3A and 3B are schematic views showing an example of the structure of an electron emitting device obtained by the present invention. FIG. 3A is a plan view, and FIG. 3B is a cross-sectional view taken on the line 3B—3B of FIG. 3A.

In FIGS. 3A and 3B, reference numeral 201 denotes an insulating substrate, 202 denotes second electrode (the contorol electrode or the extraction electrode), 203 denotes first electrode (a cathode electrode), 205 denotes a conductive material layer, and 207 denotes a carbon fiber as the emitter material.

As it is explained for FIGS. 1A to 1C-2, as the insulating substrate 201, an electrically insulating plate material such as a quartz glass can be used. With the surface thereof washed sufficiently, it is provided for the use.

The materials usable for the cathode electrode 203 and the conductive material layer 205 are same as the materials for the cathode electrode 103 and the conductive material layer 105 explained for FIGS. 1A to 1C-2. Moreover, also in this example, although it depends on the material of the particles to be used, the conductive material layer 205 needs not be always provided, but preferably it is provided. Furthermore, as the material for the electrode 202, the same material as that of the cathode electrode 203 can be used.

The carbon fiber 207 as the emitter material is a carbon fiber grown using the particles 206 (see FIGS. 2A to 2E-2) as it is already explained for FIGS. 1A to 1C-2.

Hereinafter, each step will be explained.

(Step 1)

After sufficiently washing the substrate 201, in order to form the electrode 202 and the cathode electrode 203, an electrode layer (not shown) is formed so as to cover the entire surface of the substrate 201.

Next, a resist pattern is formed using a positive type photo resist (not shown) by a photolithography process. The electrode 202 and the cathode electrode 203 are patterned with a several micron (for example, 5 μm) electrode gap (the width of the gap between the electrodes) by executing dry etching using the patterned photo resist as the mask (FIG. 2A).

Hereinafter, patterning of a thin film or a resist by a photolithography process, film formation, lifting off, etching, or the like is referred to simply as patterning.

(Step 2)

Figure 2B:
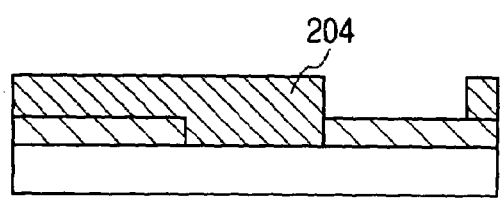
Figure 3A:
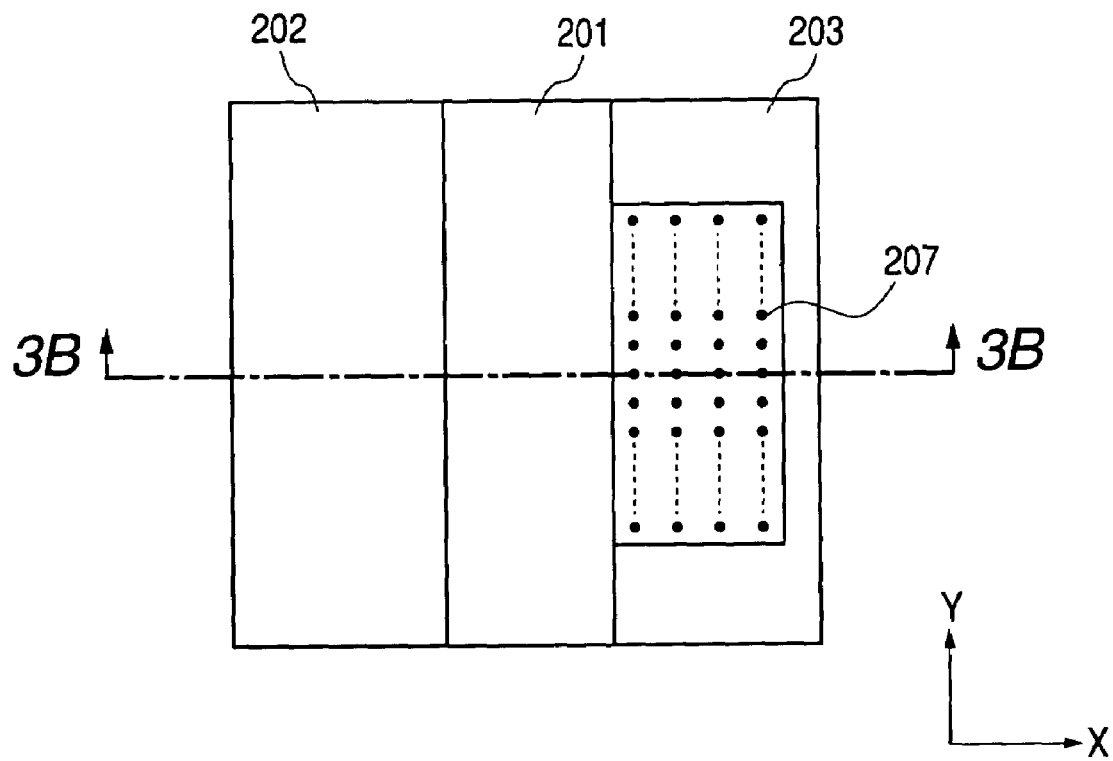
FIGS. 3A and 3B are a schematic plan view showing an example of an electron emitting device obtained by the method of producing a carbon fiber according to the present invention, and a cross-sectional view taken on the line a—a.
Figure 3B:
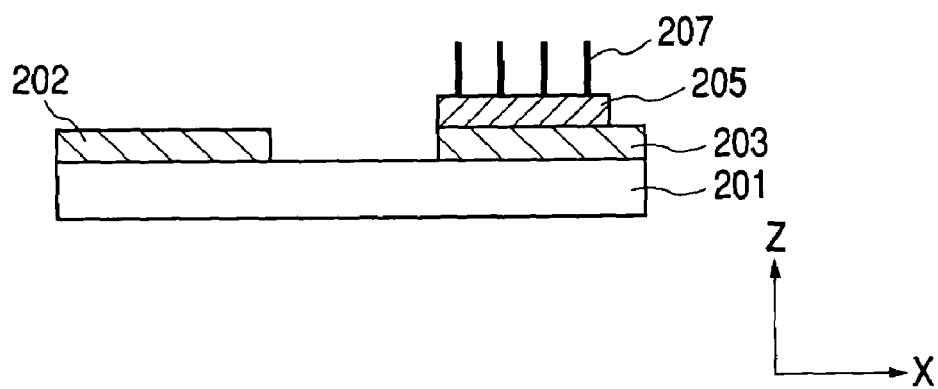

A metal 204 (e.g. Cr) for lifting off the upper part layer afterwards is patterned (FIG. 2B).

Figures 1, 2C:
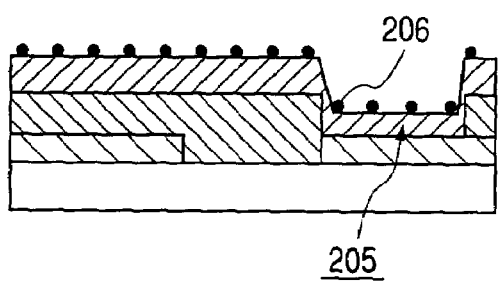
Figures 2, 2C:
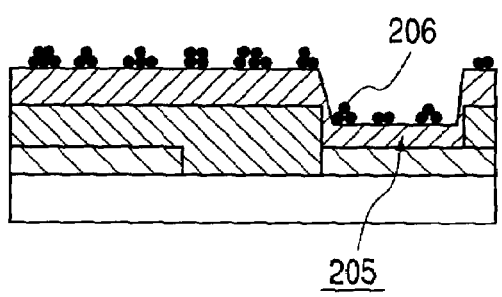

Next, the conductive material layer 205 is formed. Then, by coating a dispersion liquid of the particles 206 thereon, a coating film is provided. Then, by heating the coating film, at least the dispersion medium (and the anti aggregating agent) are eliminated (evaporated), a large number of the particles 206 are dispersed and provided on the conductive material layer 205. At the time, in the case where one with the anti aggregating agent added is used as the dispersion, the particles 206 are applied on the substrate 201 with each particle dispersed in the dispersion liquid provided with an interval provided with each other without substantial aggregation as shown in FIG. 2C-1. In contrast, in the case a dispersion liquid without adding the anti aggregating agent or with the anti aggregating agent added by a content smaller than the preferable anti aggregating agent range (described above) is used, the particles 206 are applied on the substrate 201 in a state dispersed per aggregates formed by aggregating a plurality of particles with an interval provided with each other (FIG. 2C-2).

Especially, an oxidation atmosphere is preferable to eliminating the dispersion medium and anti aggregating agent (specifically, by heating) By carrying out a heating process in an oxidation atmosphere, at least the surface of the particles 206 is oxidized and adhesion to the substrate (for example, the cathode electrode 203) is increased, thereby suppressing partial elution of the elements constituting the particle 206 and elimination of the particles 106 with the solution caused by cleaning with a peeling liquid in the patterning step in the step 3 described below. Further, a fiber can be stably grown.

(Step 3)

Figures 1, 2D:
Figures 2, 2D:

Using a peeling solution (etchant) for the metal layer 204 for lifting-off in Step 2, the conductive material layer 205 and the particles 206 on the metal layer 204 are lifted off together with the metal layer 204 so as to form a pattern of the conductive material layer 205 and the particles 206 in a desired area (FIGS. 2D-1 and 2D-2).

(Step 4)

Figures 1, 2E:
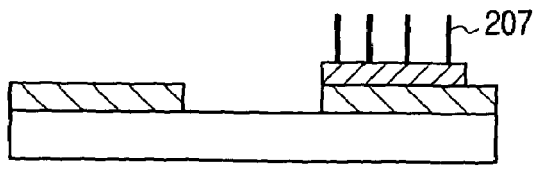
Figures 2, 2E:
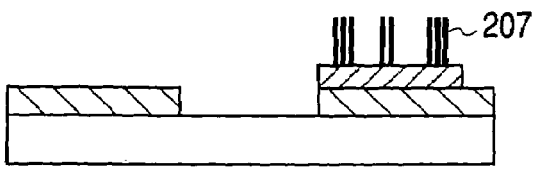

Then, a thermal decomposition (thermal CVD) process is executed for the carbon containing gas utilizing the catalyst function of the particles 206 in a carbon containing gas. According to observation with a scanning electron microscope after this process, it is learned that the carbon fibers 207 are formed (FIGS. 2E-1 and 2E-2). When an oxidation step of the particles 206 is added to the step 2, it is preferable to add a reduction step of the particles 106 (for example, a step in which the particles is heated in a reducing gas such as hydrogen) before the above step 4 (after the step 3). Further, it may carry out the above reduction step with the step 4 in which a carbon fiber is grown. That is, while the above carbon containing gas is mixed with a reducing gas such as a hydrogen gas, the above carbon fiber 207 is grown.

Further, if a carbon containing gas has reduction property, it is not necessary to add a reducing gas. The above reduction step is for generating again the catalytic function lost by the oxidation step or for enhancing the catalytic function.

The effects brought by the above oxidation step are not limited to those brought in case where a particle (catalyst particle) having catalytic function comprises two or more of elements. That is, even when the particle with catalytic function which comprises a single element (a single metal element such as Pd, Fe, Co, Ni and the like) is used, the particles can be stably disposed with good repeatability by carrying out patterning using the solution containing a peeling liquid after the above oxidation step. By carrying out the growing step of a carbon fiber after the above oxidation step, the carbon fiber having high adhesive strength to a substrate can be stably formed, whereby stable electron-emitting properties is brought. Further, such the particles having catalytic function which comprise a single element are preferably coated on a substrate in the state that such the particles are dispersed in the dispersion liquid in which the particles having catalytic function which comprise a plurality of elements are dispersed and in the dispersion liquid similar except for the composition of the particle.

According to this process, an electron emitting device having a large number of carbon fibers can be formed.

Although an example with first electrode 203 (the cathode electrode) and second electrode 202 (the extraction electrode or the control electrode) on the same substrate surface is described here, the electron emitting device of the present invention is not limited to this embodiment. For example, an embodiment of disposing a second electrode (extraction electrode or control electrode) having an opening on a first electrode (cathode electrode), and disposing a plurality of carbon fibers on the first electrode exposed in the opening as a Spint type may be employed as well. More specifically, an embodiment of disposing an insulating layer having a first opening on a first electrode (cathode electrode), and furthermore, laminating a second electrode (extraction electrode or control electrode) having a second opening for communicating with the first opening on the insulating layer, and growing and disposing a plurality of carbon fibers so as to be connected electrically with a part of the first electrode disposed in the opening comprising the first and second openings by the method of the present invention may be used.

The electron emitting characteristic of the electron emitting device having a large number of the carbon fibers 207 formed by the above described steps 1 to 4 will be explained with reference to FIGS. 4 and 5. Note that, in this example, the second electrode 202 is used as an extraction electrode for extracting electrons from the fiber 207.

Figure 4:
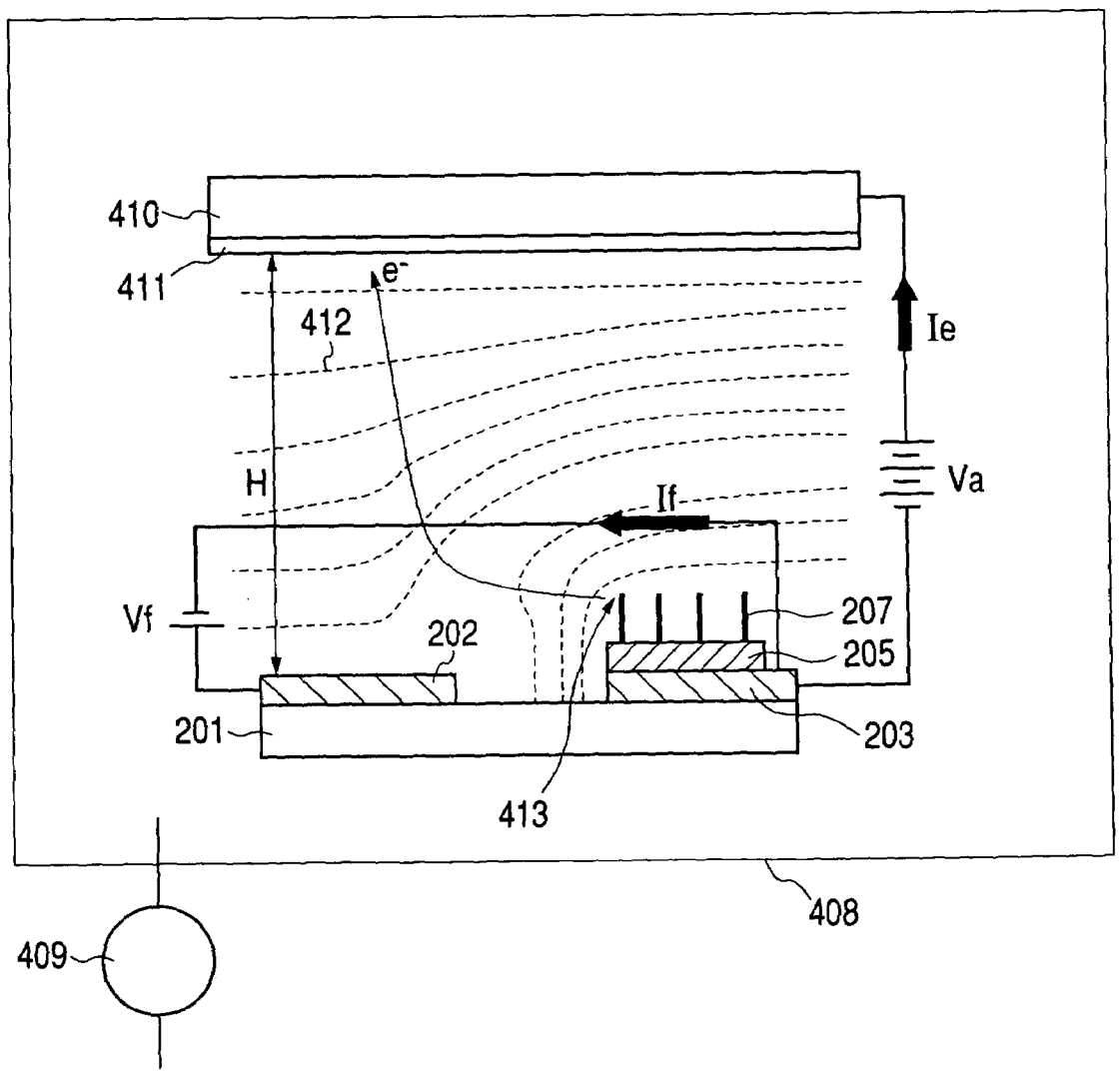
FIG. 4 is a diagram showing a configuration example at the time of operating the electron emitting device according to the present invention.

In order to measure the electron emitting characteristic, first, an electron emitting device having the second electrode (gate electrode or control electrode) 202 and the first electrode (cathode electrode) 203 disposed with a gap of several μm to several ten μm therebetween shown in FIGS. 3A and 3B is disposed in a vacuum chamber 408 shown in FIG. 4 for evacuating the inside by a vacuum evacuating device 409 to about $10^{-4}$ Pa. Then, with an anode 410 provided at a position of a height H of several millimeters from the substrate 201, a high voltage V of several kilovolts is applied using a high voltage power source. A phosphor 411 covered with a conductive film is provided on the anode 410.

Then, by applying a pulse voltage of about several ten V as the driving voltage Vf between the first electrode 203 and the second electrode 202 of the electron emitting device, an device current If and an electron emission current Ie flowing between the electrode 203 and the electrode 202 can be measured.

In FIG. 4, the equipotential lines at the time are shown by dotted lines 412. The point 413 with the most electric field concentration is assumed to be at a position of the carbon fiber 207 as the electron emitting material provided closest to the anode 410 in the vicinity of the gap between the electrode 203 and the electrode 202 so that the electrons are considered to be emitted strongly therefrom.

Figure 5:
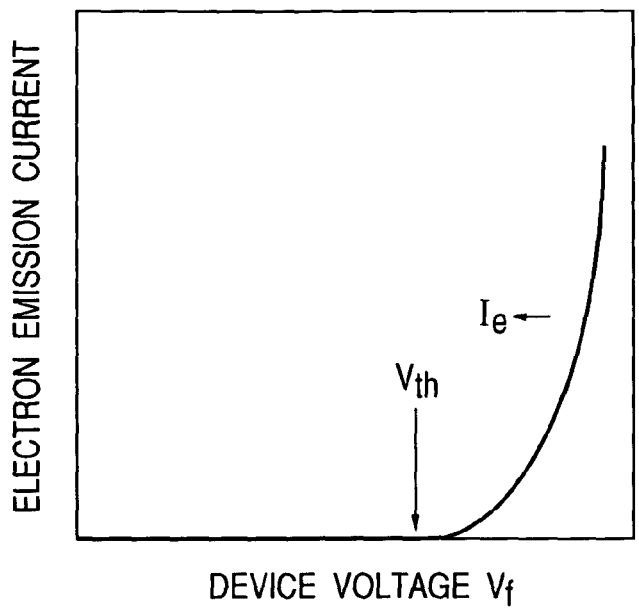
FIG. 5 is a graph showing the basic operation characteristics of the electron emitting device according to the present invention.

As the electron emitting characteristic measured by the arrangement, the characteristic shown in FIG. 5 can be obtained. That is, if the Vf (the voltage applied between the electrode 202 and the electrode 203) is increased, Ie (emission current) is raised drastically. Although the unillustrated If (the current flowing between the electrode 202 and the electrode 203) has a characteristic similar to that of the Ie, its value is sufficiently small with respect to the Ie. The electron emitting characteristic is same in the embodiment with the anode electrode disposed above the substrate 101 and without using the gate electrode 202, shown in FIGS. 1A to 1C-2.

Hereinafter, based on the principle, an image. forming apparatus obtained by disposing an electron source comprising a plurality of electron emitting devices shown in FIGS. 3A and 3B will be explained with reference to FIGS. 6 and 7. Note that, also in this example, the second electrode 202 is used as an extraction electrode for extracting electrons from the fiber 207.

Figure 6:
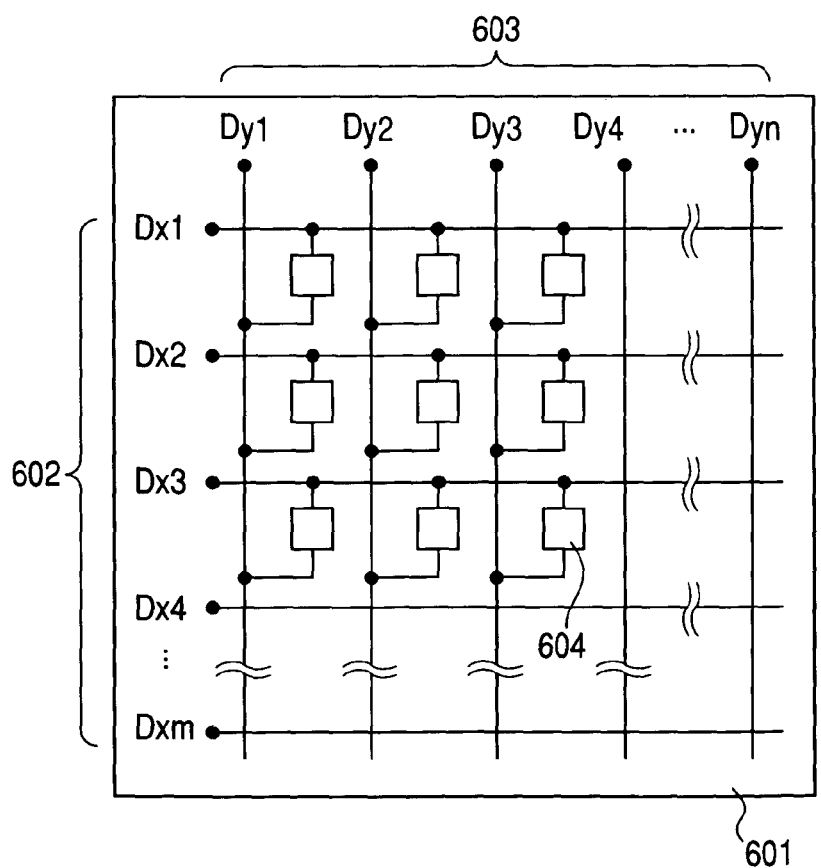
FIG. 6 is a diagram showing a configuration example of a simple matrix circuit using a plurality of electron sources according to the present invention.

In FIG. 6, reference numeral 601 is an electron source base member, 602 is an X direction wiring, and 603 is an Y direction wiring. The numeral 604 is an electron emitting device obtained by the present invention.

In FIG. 6, m pieces of the X direction wirings 602 comprise Dx1, Dx2, . . . Dxm. The material of the wirings, the film thickness and the width can be designed optionally. The Y direction wirings 603 comprise n pieces of wirings of Dy1, Dy2, . . . Dyn, and they are formed like the X direction wirings 602. An interlayer insulating layer (not shown) is provided between the m pieces of the X direction wirings 602 and the n pieces of the Y direction wirings 603 for electrically separating them (m, n are both a positive integer.)

Figure 7:
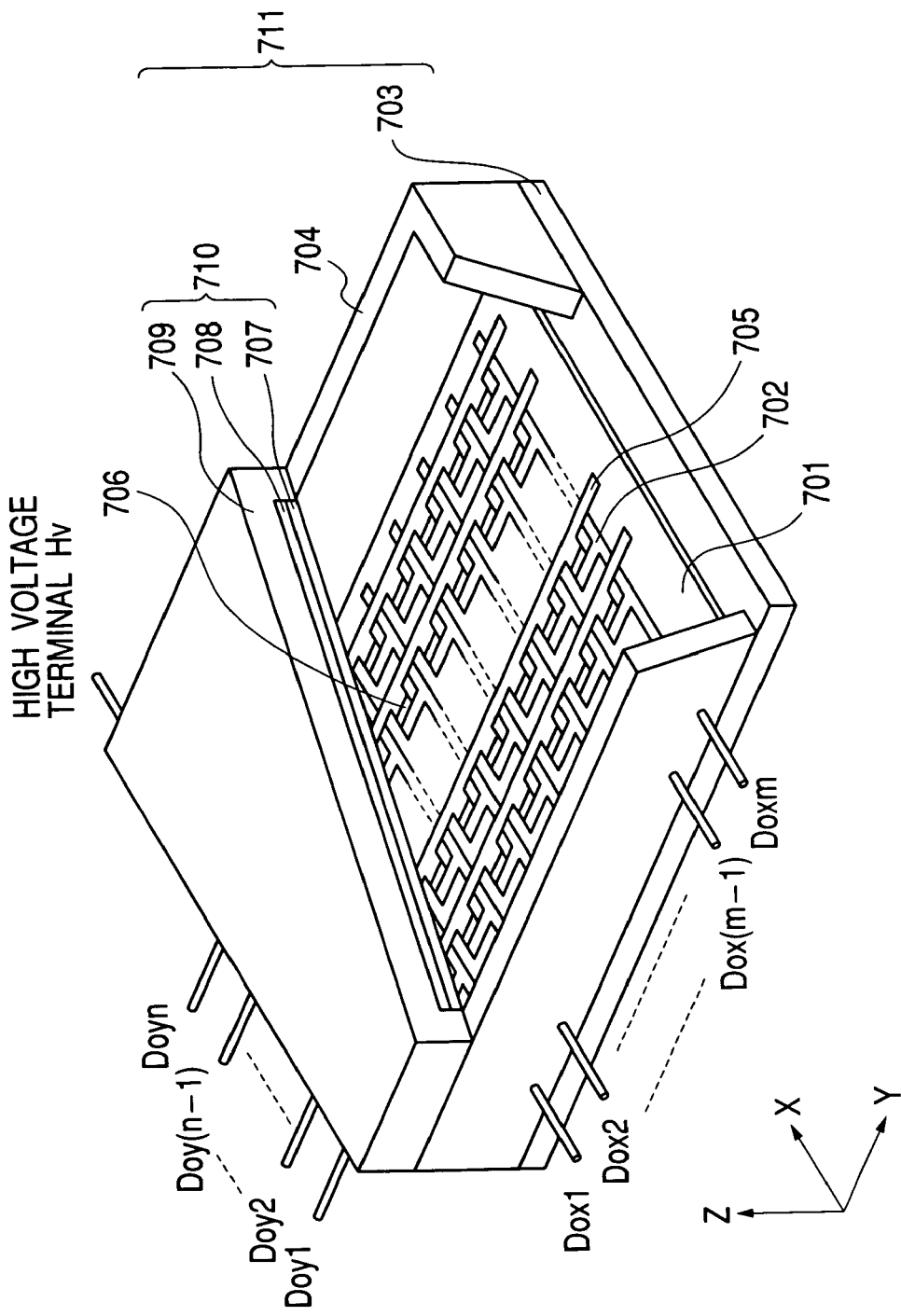
FIG. 7 is a view showing a configuration example of an image forming panel using an electron source according to the present invention.

As shown in FIG. 7, the X direction wirings 602 and the Y direction wirings 603 are led out to the outside by the connection with external terminals Dox1–Doxm, Doy1 to Doyn, respectively. Although they are distinguished as Dx1 to Dxm (Dy1 to Dyn) and Dox1 to Doxm (Doy1 to Doyn) here, each may be one continuous wiring.

Each of a pair of electrodes (the first electrode 203 and the second electrode 202 in FIGS. 3A and 3B) comprising each electron emitting device 604 is connected electrically with any of m pieces of the X direction wirings 602 and n pieces of the Y direction wirings 603.

The X direction wirings 602 are connected with scanning signal applying means (not shown) for applying a scanning signal for selecting, for example, the row of the electron emitting devices 604 arranged in the X direction. In contrast, the Y direction wirings 603 are connected with modulating signal generating means (not shown) for modulating each column of the electron emitting devices 604 arranged in the Y direction according to the inputted signal for selecting the individual electron emitting device 604 for allowing the independent drive.

An image forming apparatus comprising such an electron source of the simple matrix arrangement will be explained with reference to FIG. 7.

FIG. 7 is a diagram showing an image display apparatus (flat panel display) as an example of an image forming apparatus obtained by the present invention.

In FIG. 7, reference numeral 701 is an electron source base member with a plurality of electron emitting devices 706 of the present invention provided, 703 is a rear plate with the electron source base member 701 fixed, and 710 is a face plate comprising a fluorescent film 708, a metal back (a metal film comprising Al, or the like) 707, or the like provided on the inner surface of a glass base member 709. Reference numeral 704 is a supporting frame, which is connected with the rear plate 703 and the face plate 710. Reference numeral 711 is an envelope, which is provided by sealing the face plate 710, supporting frame 704, and rear plate 703 with each other. The inside of the envelope is maintained in a vacuum state.

Reference numerals 702, 705 are X direction wirings and Y direction wirings, which are explained with reference to FIG. 6, connected with the electron emitting device 706.

As mentioned above, the envelope 711 comprises the face plate 710, the supporting frame 704, and the rear plate 703. In contrast, an envelope 711 having a sufficient strength with respect to the atmospheric pressure can be provided by disposing an unillustrated supporting member called a spacer between the face plate 710 and the rear plate 703.

The configuration of the image forming apparatus described here is an example of the image forming apparatus obtained by the present invention, and thus various modification can be made based on the technological idea of the present invention. As to the input signal, in addition to the NTSC method, the PAL, the SECAM method, or the like, a TV signal (for example, a high grade TV such as the MUSE method) having a larger number of scanning lines can be employed as well. Moreover, in addition to the display unit for the television broadcast, the display unit for the television conference system, the computer, or the like, the image forming apparatus obtained by the present invention can be used as an optical printer comprising a photo sensitive drum, or the like.

EXAMPLES

Hereinafter, the present invention will be explained in further detail.

Example 1

Alloy particles with the composition including Pd (60 atm %) and Co (40 atm %), having a 5 nm average particle size were prepared, and a dispersion liquid with the alloy particles dispersed by 0.1 g/L was formed. In the dispersion liquid, an ethanol was used as the dispersion medium, and 5 wt % of PVP (polyvinyl pyrrolidone) was added as the anti aggregating agent for dispersing the alloy particles as a single body.

Hereinafter, a production process of the electron emitting device of this embodiment shown in FIGS. 2A to 2E-2, using the dispersion liquid will be explained in detail.

(Step 1)

A quartz substrate was used as the substrate 201. After sufficiently washing the same, first a Ti base (not shown) of 5 nm thickness and Pt of 100 nm thickness were deposited successively by the sputtering method on the entire substrate 201 for forming the extraction electrode 202 and the cathode (emitter) electrode 203.

Next, a resist pattern was formed, using an positive type photo resist (not shown) by the photolithography process. With the patterned photo resist used as the mask, the Pt layer and Ti layer were dry etched so as to pattern the extraction electrode 202 and the cathode electrode 203 with a 5 μm electrode gap (FIG. 2A).

(Step 2)

A metal Cr 204 for lifting off the upper part layer afterwards is patterned (FIG. 2B).

Next, a TiN layer was formed as the conductive material layer 205.

The dispersion liquid of the alloy particles 206 was coated thereon with a 2,000 rpm condition using a spinner. After coating, the dispersion medium and anti aggregating agent are removed and the particles are oxidized in a clean oven by the oxidation step at 350° C. for 10 min. in the atmosphere (FIG. 2C-1). Thereafter, the lift-off was carried out.

(Step 3)

By lifting off the conductive material layer 205 and the alloy particles 206 on the layer of Cr 204 together with the resist pattern 204 using the peeling solution for the resist patterned in Step 2 so as to form a pattern of the conductive material layer 205 and the alloy particles 206 in a desired area (FIG. 2D-1).

(Step 4)

Next, the particles were reduced in the hydrogen gas containing atmosphere. Then, a heating process was executed at 550 degrees centigrade in a mixture atmosphere of an ethylene and a hydrogen. According to observation with a scanning electron microscope after the process, it was confirmed that the carbon fibers 207 were formed discretely substantially one by one (FIG. 2E-1).

With the electron emitting device produced as mentioned above disposed in the vacuum chamber 408 shown in FIG. 4 for sufficiently evacuating the inside by the vacuum evacuating device 409 to about $2 \times 10^{-5}$ Pa, Va=10 KV was applied as the anode voltage to the anode 411 disposed away from the substrate 201 by H=2 mm. At the time, a pulse voltage of the driving voltage Vf=20 V was applied to the electron emitting device, and the flowing device current If and the electron emission current Ie were measured.

The If, Ie characteristics of the device were as shown in FIG. 5. That is, after exceeding the threshold voltage, the Ie is increased drastically so that about 1 μA of the electron emission current Ie was measured with 15 V of Vf. In contrast, although the If has a characteristic similar to that of the Ie, its value was smaller than the Ie by more than one digit.

Moreover, the electric field was applied effectively compared with the case of providing the carbon fibers 207 densely so that the threshold value (electron emission) voltage was reduced.

Example 2

A dispersion liquid prepared by dispersing alloy particles with the composition including Pd (60 atm %) and Ni (40 atm %), having a 8 nm average particle size by 0.1 g/L was used. Using pure water as the dispersion medium without using the anti aggregating agent used in Example 1, a dispersion liquid with the alloy fine particles provided in a state of aggregates of several particles to several ten particles was formed.

In this embodiment, the electron emitting device was produced in the same manner as in Example 1 except that Step 2 in Example 1 was executed as follows.

(Step 2)

A metal Cr 204 for lifting off the upper part layer afterwards is patterned (FIG. 2B).

Next, a TiN layer was formed as the conductive material layer 205 for growing the carbon fibers 207 via the alloy particles 206.

The dispersion liquid of the alloy particles 206 was coated thereon with a 3,000 rpm condition using a spinner. After coating, the dispersion medium and anti aggregating agent are removed and the particles are oxidized by the oxidation step at 350° C. for 10 min. in the atmosphere (FIG. 2C-2). Thereafter, the lift-off was carried out.

According to observation with a scanning electron microscope after executing a reducing process in the hydrogen gas containing atmosphere, a heating process after the reducing process in a mixture atmosphere of an ethylene and a hydrogen, it was confirmed that the carbon fibers 207 were grown and formed discretely as a unit of a several fibers to several ten fibers of a bundle (FIG. 2E-2). In contrast, large aggregates of the alloy particles exists, and as a whole, the carbon fiber density uniformity was low.

As in the case of Example 1, the If, Ie characteristics of the obtained electron emitting device were as shown in FIG. 5. That is, after exceeding the threshold voltage, the Ie is increased drastically so that about 1 μA of the electron emission current Ie was measured with 15 V of Vf. In contrast, although the If has a characteristic similar to that of the Ie, its value was smaller than the Ie by more than one digit.

Moreover, although the electric field was applied effectively compared with the conventional case of providing the carbon fibers by a high particle density so as to reduce the threshold value (electron emission) voltage, the characteristic reproducivity was lower than the electron emitting device produced in Example 1.

Example 3

A dispersion liquid with alloy particles with the composition including Pd (70 atm %) and Fe (30 atm %), having a 10 nm average particle size dispersed by 0.1 g/L was prepared. As the dispersion medium, an isopropyl alcohol was used. Moreover, PVA (polyvinyl alcohol) was added in the 10 wt % dispersion as the anti aggregating agent in this embodiment so as to disperse the alloy particles as a single body.

In this embodiment, the electron emitting device was produced in the same manner as in Example 1 except that Step 2 in Example 1 was executed as follows.

(Step 2)

A metal Cr 204 for lifting off the upper part layer afterwards is patterned (FIG. 2B).

Next, a TiN layer was formed as the conductive material layer 205.

The dispersion liquid of the alloy particles 206 was coated from above the substrate 201 using the spray method. After coating, the dispersion medium and anti aggregating agent are removed and the particles are oxidized in a clean oven by the oxidation step at 350° C. for 10 min. in the atmosphere (FIG. 2C-1). Thereafter, the lift-off was carried out.

According to observation with a scanning electron microscope after executing a reduction process in the hydrogen gas containing atmosphere and then a heating process at 550 degrees centigrade in a mixture atmosphere of an acetylene and a hydrogen, it was confirmed that the carbon fibers 207 were grown and formed discretely substantially one by one (FIG. 2E-1).

As in the case of Example 1, the If, Ie characteristics of the obtained electron emitting device were as shown in FIG. 5. That is, after exceeding the threshold voltage, the Ie is increased drastically so that about 1 μA of the electron emission current Ie was measured with 15 V of Vf.

The electric field was applied effectively compared with the case of the carbon fibers 207 provided densely so that the threshold value (electron emission) voltage was reduced.

As heretofore explained, according to the method of producing an electron emitting device using a carbon fiber using particles containing two or more kinds of different elements of the present invention, the carbon fibers can be grown stably and preferably at a low temperature without the need of a high temperature alloy process on a substrate so that the electron emitting device using the carbon fibers can be obtained easily. Additionally, since production can be enabled at a low temperature, adverse effect to the other members by heating or production cost rise can be prevented.

Moreover, by further adding an anti aggregating agent (polymer) to the dispersion with the particles dispersed, the particle concentration and the particle providing density can be adjusted easily so that the electric field necessary for the electron emission can be applied further effectively on the carbon fibers. Thereby, the threshold voltage for the electron emission can be lowered so that the electric field needed for obtaining the electron emission current of the same value can be reduced.

Furthermore, by using alloy fine particles of Pd and a specific additional element as the catalyst, the risk of the dust explosion can be eliminated so that not only the explosion preventing equipment for the production apparatus can be omitted but also the shape change to the particles having a shape larger than the initial state, which is generated only in the case of the Pd, can be prevented, and thus the carbon fiber growing temperature rise and the electron emission threshold value rise can be prevented.

What is claimed is:

1. A method of producing an electron-emitting device having a carbon fiber, comprising:
   (A) applying a liquid including dispersed particles onto a substrate; and
   (B) forming a carbon fiber by contacting the particles applied on the substrate with a carbon containing gas,
   wherein each of said particles contains (i) Pd and (ii) at least one element selected from the group consisting of Fe, Co, Ni, Y, Rh, Pt, La, Ce, Pr, Nd, Gd, Tb, Dy, Ho, Er, and Lu, and
   wherein said liquid further contains a polymer.

2. The method according to claim 1, wherein each of said particles contains said element by 5 atm % or more and 80 atm % or less (atomic percentage) with respect to Pd.

3. The method according to claim 1, wherein said polymer is a water-soluble polymer.

4. The method according to claim 1, wherein said polymer is any one selected from the group consisting of polyvinyl pyrrolidone, polyvinyl alcohol and polyacrylic acids.

5. The method according to claim 4, wherein said polyacrylic acids are any one selected from the group consisting of polyacrylic acid, polymethacrylic acid, and homologue thereof.

6. The method according to claim 1, wherein said polymer is contained by 0.1 wt % or more and 30 wt % or less with respect to said liquid.

7. The method according to claim 1, wherein said polymer is contained by 0.2 wt % or more and 10 wt % or less with respect to said liquid.

8. The method according to claim 1, wherein an average particle size of the particles is 1 nm or more and 100 nm or less.

9. The method according to claim 1, wherein an average particle size of the particles is 1 nm or more and 50 nm or less.

10. The method according to claim 1, wherein an average particle size of the particles is 1 nm or more and 20 nm or less.

11. The method according to claim ,1 wherein said polymer covers the particles by average film thickness in a range of 2.5 nm or more and 25 nm or less.

12. The method according to claim 1, wherein said particles are contained by a ratio of 1 g/L or less with respect to said liquid.

13. The method according to claim 1, wherein said particles are contained by a ratio of 0.1 g/L or less with respect to said liquid.

14. The method according to claim 12, wherein said particles are contained by a ratio of 0.01 g/L or more with respect to said liquid.

15. The method according to claim 1, wherein said carbon fiber is any one of a carbon nano tube, a graphite nano fiber, an amorphous carbon fiber, and a diamond fiber.

16. A method of producing an electron source having a plurality of electron-emitting devices, wherein said electron-emitting devices are produced by the method of producing an electron-emitting device according to claim 1.

17. A method of producing an image-forming apparatus comprising an electron source, and an image-forming member disposed facing said electron source, wherein said electron source is produced by the method of producing an electron source according to claim 16.

18. A method of producing an electron-emitting device having a carbon fiber, comprising
    (A) applying a liquid including a polymer and a plurality of catalytic particles onto a substrate; and
    (B) forming a carbon fiber by contacting the catalytic particles with a carbon containing gas.

19. The method according to claim 18, wherein said particles contain (i) Pd and (ii) at least one element selected from the group consisting of Fe, Co, Ni, Y, Rh, Pt, La, Ce, Pr, Nd, Gd, Tb, Dy, Ho, Er, and Lu by 5 atm % or more and 80 atm % or less (atomic percentage) with respect to Pd.

20. The method according to claim 18, wherein said polymer covers the particles.

21. A method of producing an electron source having a plurality of electron-emitting devices, wherein said electron-emitting devices are produced by the method of producing an electron-emitting device according to claim 18.

22. A method of producing an image-forming apparatus comprising an electron source, and an image-forming member disposed facing said electron source, wherein said electron source is produced by the method of producing an electron source according to claim 21.

23. A method of producing an electron-emitting device having a carbon fiber, comprising:
    (A) applying a liquid including dispersed particles onto a substrate; and
    (B) forming a carbon fiber by contacting the particles applied on the substrate with a carbon containing gas,
    wherein each of said particles contains (i) Pd and (ii) at least one element selected from the group consisting of Fe, Co, Ni, Y, Rh, Pt, La, Ce, Pr, Nd, Gd, Tb, Dy, Ho, Er, and Lu, and said particles are contained by a ratio of 1 g/L or less with respect to said liquid.

24. The method according to claim 23, wherein said particles are contained by a ratio of 0.1 g/L or less with respect to said liquid.

25. The method according to claim 23, wherein said particles are contained by a ratio of 0.01 g/L or more with respect to said liquid.

26. A method of producing an electron source having a plurality of electron-emitting devices, wherein said electron-emitting devices are produced by the method of producing an electron-emitting device according to claim 23.

27. A method of producing an image-forming apparatus comprising an electron source, and an image-forming member disposed facing said electron source, wherein said electron source is produced by the method of producing an electron source according to claim 26.

* * * * *

UNITED STATES PATENT AND TRADEMARK OFFICE
CERTIFICATE OF CORRECTION

PATENT NO. : 7,147,533 B2
APPLICATION NO. : 10/661627
DATED : December 12, 2006
INVENTOR(S) : Shinichi Kawate et al.

It is certified that error appears in the above-identified patent and that said Letters Patent is hereby corrected as shown below:

COLUMN 1:

Line 16, "the" (first occurrence) should be deleted; and
Line 22, "an" should read --a--.

COLUMN 2:

Line 59, "a" (second occurrence) should be deleted.

COLUMN 3:

Line 6, "ore" should read --or--;
Line 45, "a" should be deleted; and
Line 64, "an" should read --a--.

COLUMN 4:

Line 13, "tend" should read --tends--.

COLUMN 5:

Line 9, "anti aggregating" should read --anti-aggregating--;
Line 23, "anti aggregating" should read --anti-aggregating--;
Line 27, "anti aggregating" should read --anti-aggregating--;
Line 48, "anti aggregating" should read --anti-aggregating--;
Line 53, "anti aggregating" should read --anti-aggregating--; and
Line 58, "anti aggregating" should read --anti-aggregating--.

COLUMN 6:

Line 26, "pattering." should read --patterning.--;
Line 27, "pattern" should read --patterning--;
Line 49, "basically" should read --basically the--; and
Line 58, "kind" should read --kinds--.

COLUMN 7:

Line 1, "Applying" should read --applying--;
Line 44, "multi wall" should read --multi-wall--;
Line 60, "non" should read --not--; and
Line 65, "comprises" should read --comprises a--.

UNITED STATES PATENT AND TRADEMARK OFFICE
CERTIFICATE OF CORRECTION

PATENT NO. : 7,147,533 B2
APPLICATION NO. : 10/661627
DATED : December 12, 2006
INVENTOR(S) : Shinichi Kawate et al.

It is certified that error appears in the above-identified patent and that said Letters Patent is hereby corrected as shown below:

COLUMN 8:

Line 19, "include" should read --includes--;
Line 24, "are" should be deleted;
Line 25, "of" (first occurrence) should read --of the--;
Line 30, "has" should read --has a--; and "are" should read --do--; and
Line 62, "a" should read --an--.

COLUMN 9:

Line 1, "also," should read --also--;
Line 4, "connected" should read --connected to--;
Line 16, "shows" should read --show--;
Line 21, "from" should read --from,--;
Line 30, "electrode," should read --electrode;--;
Line 31, "needs" should read --need--;
Line 45, "the" should be deleted;
Line 47, "tuber," should read --tube,--;
Line 64, "to" should read --for--;
Line 65, "anti aggregating" should read --anti-aggregating--; and
Line 66, "heating)" should read --heating).--.

COLUMN 10:

Line 16, "anti aggregating" should read --anti-aggregating--;
Line 22, "anti aggregating" should read --anti-aggregating--; and "anti aggregating" should read --anti-aggregating--;
Line 33, "Step2" should read --Step 2--;
Line 35, "region" should read --regions--;
Line 37, "was" should read --is--; and "is" should read --is the--;
Line 39, "was" should read --is--; and "is uswanted" should read --is the unwanted--;
Line 46, "anti aggregating" should read --anti-aggregating--;
Line 49, "case" should read --case of--; and "anti" should read --anti- --;
Line 50, "anti aggregating" should read --anti-aggregating--; and
Line 56, "is" should read --are--.

UNITED STATES PATENT AND TRADEMARK OFFICE
CERTIFICATE OF CORRECTION

PATENT NO. : 7,147,533 B2
APPLICATION NO. : 10/661627
DATED : December 12, 2006
INVENTOR(S) : Shinichi Kawate et al.

It is certified that error appears in the above-identified patent and that said Letters Patent is hereby corrected as shown below:

COLUMN 11:

Line 6, "particle con-" should read --particle-con--;
Line 22, "an" should be deleted;
Line 47, "the" should be deleted;
Line 49, "are" should read --are the--; and
Line 53, "needs" should read --need--.

COLUMN 12:

Line 12, "(e.g." should read --(e.g.,--;
Line 17, "anti aggregating" should read --anti-aggregating--;
Line 21, "anti aggregating" should read --anti-aggregating--;
Line 26, "anti aggregating" should read --anti-aggregating--;
Line 27, "anti aggregating" should read --anti-aggregating--;
Line 28, "anti aggregating" should read --anti-aggregating--;
Line 34, "anti aggregating" should read --anti-aggregating--;
Line 35, "heating)" should read --heating).--; and
Line 62, "is" should read --are--.

COLUMN 13:

Line 17, "is" should read --are--; and
Line 67, "an" should read --a--.

COLUMN 14:

Line 19, "is" should read --is the--;
Line 23, "image." should read --image--; and
Line 31, "an" (second occurrence) should read --a--.

COLUMN 15:

Line 54, "anti" should read --anti---.

COLUMN 16:

Line 1, "an" should read --a--;
Line 15, "anti aggregating" should read --anti-aggregating--;
Line 62, "a" should read --an--; and
Line 64, "anti aggregating" should read --anti-aggregating--.

UNITED STATES PATENT AND TRADEMARK OFFICE
CERTIFICATE OF CORRECTION

PATENT NO. : 7,147,533 B2
APPLICATION NO. : 10/661627
DATED : December 12, 2006
INVENTOR(S) : Shinichi Kawate et al.

It is certified that error appears in the above-identified patent and that said Letters Patent is hereby corrected as shown below:

COLUMN 17:

Line 12, "anti aggregating" should read --anti-aggregating--;
    Line 21, "a" (second occurrence) should be deleted;
    Line 23, "exists," should read --exist,--;
    Line 47, "anti aggregating" should read --anti-aggregating--; and
    Line 60, "anti aggregating" should read --anti-aggregating--.

COLUMN 18:

Line 24, "anti aggregating" should read --anti-aggregating--.

COLUMN 19:

Line 16, "claim ,1" should read --claim 1,--; and
    Line 41, "comprising" should read --comprising:--.

Signed and Sealed this

Third Day of July, 2007

JON W. DUDAS
*Director of the United States Patent and Trademark Office*